(12) United States Patent
Ma et al.

(10) Patent No.: US 10,608,097 B2
(45) Date of Patent: Mar. 31, 2020

(54) LOW THICKNESS DEPENDENT WORK-FUNCTION NMOS INTEGRATION FOR METAL GATE

(71) Applicant: Applied Materials, Inc., Santa Clara, CA (US)

(72) Inventors: Paul F. Ma, Santa Clara, CA (US); Seshadri Ganguli, Sunnyvale, CA (US); Shih Chung Chen, Cupertino, CA (US); Rajesh Sathiyanarayanan, Bangalore (IN); Atashi Basu, Menlo Park, CA (US); Lin Dong, San Jose, CA (US); Naomi Yoshida, Sunnyvale, CA (US); Sang Ho Yu, Cupertino, CA (US); Liqi Wu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/033,880

(22) Filed: Jul. 12, 2018

(65) Prior Publication Data

US 2019/0019874 A1    Jan. 17, 2019

Related U.S. Application Data

(60) Provisional application No. 62/532,337, filed on Jul. 13, 2017.

(51) Int. Cl.
| | |
|---|---|
| *H01L 29/51* | (2006.01) |
| *H01L 21/28* | (2006.01) |
| *H01L 29/40* | (2006.01) |
| *H01L 29/49* | (2006.01) |
| *H01L 21/285* | (2006.01) |
| *H01L 21/8234* | (2006.01) |
| *H01L 21/8238* | (2006.01) |

(52) U.S. Cl.
CPC ...... *H01L 29/513* (2013.01); *H01L 21/28088* (2013.01); *H01L 21/28518* (2013.01); *H01L 21/28568* (2013.01); *H01L 21/82345* (2013.01); *H01L 21/823842* (2013.01); *H01L 29/401* (2013.01); *H01L 29/4966* (2013.01); *H01L 29/517* (2013.01)

(58) Field of Classification Search
CPC .................. H01L 29/511; H01L 21/82345
See application file for complete search history.

(56) References Cited

U.S. PATENT DOCUMENTS

| | | | |
|---|---|---|---|
| 2013/0122697 A1 | 5/2013 | Lu et al. | |
| 2014/0264483 A1* | 9/2014 | Yoshida | H01L 21/28079 257/288 |
| 2016/0093711 A1 | 3/2016 | Hong et al. | |
| 2017/0092644 A1 | 3/2017 | Cheng et al. | |
| 2017/0110324 A1 | 4/2017 | Tsai et al. | |
| 2017/0110551 A1 | 4/2017 | Lee et al. | |
| 2017/0125298 A1* | 5/2017 | Jangjian | H01L 21/82345 |

OTHER PUBLICATIONS

PCT International Search Report and Written Opinion in PCT/US2018/041825 dated Nov. 29, 2018, 12 pages.

* cited by examiner

*Primary Examiner* — Farun Lu
(74) *Attorney, Agent, or Firm* — Servilla Whitney LLC

(57) ABSTRACT

Film stacks and methods of forming film stacks including a high-k dielectric layer on a substrate, a high-k capping layer on the high-k dielectric layer, an n-metal layer on the high-k capping layer and an n-metal capping layer on the n-metal layer. The n-metal layer having an aluminum rich interface adjacent the high-k capping layer.

17 Claims, 1 Drawing Sheet

LOW THICKNESS DEPENDENT WORK-FUNCTION NMOS INTEGRATION FOR METAL GATE

CROSS-REFERENCE TO RELATED APPLICATIONS

This application claims priority to U.S. Provisional Application No. 62/532,337, filed Jul. 13, 2017, the entire disclosure of which is hereby incorporated by reference herein.

TECHNICAL FIELD

Embodiments of the disclosure generally relate to the fabrication of semiconductors, including processes for formation of n-metal stacks. More particularly, embodiments of the disclosure are directed to n-metal gate stacks and methods for producing same.

BACKGROUND

Continuous scaling of MOSFET results in smaller gate fill volumes for low resistivity metal (e.g., tungsten) deposition after formation of the metal gate stack. Suitable n-metal films have low work function (WF) thickness dependence and low resistivity. Additionally, the band edge work function performance should achieve both usable threshold voltage behavior and minimize short channel effects.

Existing n-metal TiAlC has high resistivity (>2000μΩ-cm) and requires ~30 Å to achieve the useful work function for 10 nm devices. Thinning the TiAl film thickness to 20 Å and below leads to a significant increase in the effective WF. Further WF reduction is dependent on increasing Al concentration, which results in integration reliability and chamber defect challenges.

Therefore, there is a need in the art for integration schemes, gate stacks and new materials for work function scaling.

SUMMARY

One or more embodiments of the disclosure are directed to film stacks comprising a high-k dielectric layer on a substrate. A high-k capping layer is on the high-k dielectric layer. An n-metal layer is on the high-k capping layer. The n-metal layer has an aluminum rich interface adjacent the high-k capping layer between the high-k capping layer and the n-metal capping layer or between the high-k capping layer and the high-k dielectric layer. An n-metal capping layer is on the n-metal layer.

Additional embodiments of the disclosure are directed to methods of forming a film stack. A high-k dielectric layer is formed on a substrate. A high-k capping layer is formed on the high-k dielectric layer. An n-metal layer is formed on the high-k capping layer. The n-metal layer has an aluminum rich interface adjacent the high-k capping layer between the high-k capping layer and the n-metal capping layer or between the high-k capping layer and the high-k dielectric layer. An n-metal capping layer is formed on the n-metal layer.

Further embodiments of the disclosure are directed to film stacks comprising a substrate with a surface comprising a silicon oxide layer. A HfO2 layer is on the silicon oxide layer. The $HfO_2$ layer has a thickness in the range of about 10 Å to about 20 Å. A titanium nitride layer is on the $HfO_2$ layer. The titanium nitride layer has a thickness in the range of about 5 Å to about 20 Å. An n-metal layer comprising TaSiAl with a thickness in the range of about 10 Å to about 30 Å is on the titanium nitride layer. The n-metal layer has an aluminum rich interface adjacent the titanium nitride layer. An n-metal capping layer comprising in the range of about 10 Å to about 60 Å titanium nitride is on the n-metal layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figures 1A, 1B:
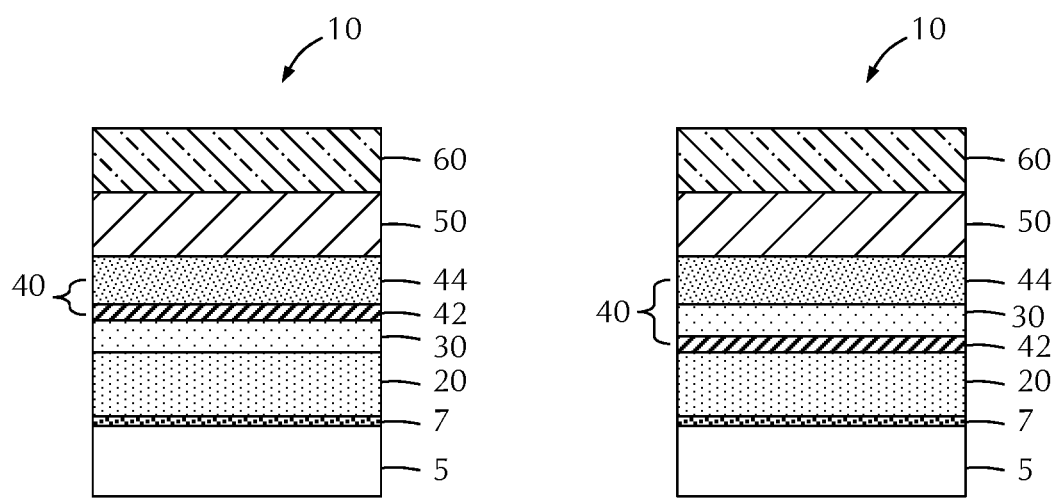
FIG. 1A shows a film stack in accordance with one or more embodiment of the disclosure.
FIG. 1B shows a film stack in accordance with one or more embodiment of the disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which processing is performed. For example, a substrate surface on which processing can be performed include, but are not limited to, materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what materials are to be deposited, as well as the particular chemistry used.

Embodiments of the disclosure advantageously provide methods of forming n-metal layers with low work functions. Some embodiments advantageously provide low work function n-metal layers with small thicknesses. Some embodiments advantageously provide methods for depositing an n-metal layer with an aluminum-rich interface.

With reference to FIG. 1A, one or more embodiment of the disclosure is directed to a film stack 10. In some embodiments, the film stack 10 is part of a gate stack in a metal oxide semiconductor (MOS).

The film stack 10 is formed on substrate 5 which can be any suitable material or shape. In the embodiment illustrated, the substrate 5 is a flat surface and the film stack 10 is represented by rectangular boxes. However, those skilled in the art will understand that the substrate 5 can have one or more features (i.e., trenches or vias) and that the film stack 10 can be formed to conform to the shape of the substrate 5 surface.

In some embodiments, an oxide layer 7 is on the substrate 5. The oxide layer 7 can be formed by oxidation of the surface of the substrate 5 or deposited as a film on the substrate. The oxide layer 7 can be any suitable material including, but not limited to, silicon oxide. The oxide layer 7 of some embodiments is a native oxide on the substrate 5. For example, a silicon substrate may oxidize in air to form a native oxide layer on the silicon. In some embodiments, the thickness of the oxide layer is less than or equal to about 15 Å, 14 Å, 13 Å, 12 Å, 11 Å, 10 Å, 9 Å, 8 Å, 7 Å or 6 Å. In some embodiments, the oxide layer 7 has a thickness in the range of about 2 Å to about 15 Å, or in the range of about 5 Å to about 10 Å.

A high-k dielectric layer 20 is formed on the substrate 5 or the oxide layer 7. The oxide layer 7 being optional. The high-k dielectric layer 20 can be any suitable high-k dielectric including, but not limited to, hafnium oxide ($HfO_2$). In some embodiments, the thickness of the high-k dielectric layer 20 is in the range of about 5 Å to about 30 Å, or in the range of about 10 Å to about 20 Å. In some embodiments, the substrate 5 comprises an oxide layer 7 prior to formation of the high-k dielectric layer 20. In some embodiments, the oxide layer 7 is a native oxide or an intentionally formed oxide layer 7. In some embodiments, the high-k dielectric layer 20 is formed on the substrate 5 without an intervening oxide layer 7.

The high-k dielectric layer 20 can be formed by any suitable process. In some embodiments, the high-k dielectric layer 20 is deposited by atomic layer deposition or chemical vapor deposition using a hafnium precursor (e.g., tetrakis (dimethylamino)hafnium) and an oxidizing agent (e.g., $O_2$).

A high-k capping layer 30 is formed on the high-k dielectric layer 20. The high-k capping layer 30 can be any suitable material including, but not limited to, titanium nitride. The high-k capping layer 30 of some embodiments has a thickness in the range of about 5 Å to about 20 Å.

An n-metal layer 40 is formed on the high-k capping layer 30. The n-metal layer 40 is illustrated as two layers: an aluminum-rich layer 42 and a bulk n-metal layer 44. The n-metal layer 40 is deposited as a single material and the interfacial layer (i.e., the aluminum-rich layer 42) can form through diffusion and migration of the aluminum atoms in the n-metal layer 40.

In some embodiments, the n-metal layer 40 comprises an aluminum/tantalum silicide (Al/TaSi) film. The n-metal layer 40 (i.e., the Al/TaSi layers) can be deposited by atomic layer deposition (ALD) through alternatively pulsing tantalum (Ta), aluminum (Al), and silicon (Si) precursors, separated by argon (Ar) (or other inert gas) purges. The order of the precursor pulses can be varied. The Al/TaSi film can be deposited at any suitable temperature. In some embodiments, the temperature of the Al/TaSi deposition is in the range of about 250° C. to about 600° C., or in the range of about 300° C. to about 500° C., or in the range of about 400° C. to about 450° C. The pressure during deposition can be in the range of about 10 mT to about 100 T, or in the range of about 100 mT to about 50 T, or in the range of about 1 mT to about 10 T, or about 3 T.

Without being bound by any particular theory of operation, it is believed that during or after the deposition, aluminum segregates to the interface, forming an interfacial aluminum-rich layer 42. The concentration of aluminum in the aluminum-rich layer 42 can be in the range of about 1% to about 20%, on an atomic basis. In some embodiments, the aluminum-rich layer 42 has an aluminum concentration in the range of about 5% to about 18%, or in the range of about 8% to about 15%, on an atomic basis.

The aluminum composition of the bulk n-metal layer 44 is less than the aluminum composition of the aluminum-rich layer 42. In some embodiments, the aluminum concentration of the bulk n-metal layer 44 is greater than or equal to about 0.5 at. %, 1 at. %, 1.5 at. %, 2 at. %, 2.5 at. %, 3 at. %, 3.5 at. %, 4 at. %, 4.5 at. % or 5 at. % lower than the aluminum-rich layer 42. In some embodiments, the aluminum composition of the bulk n-metal layer 44 is less than or equal to about 10%, 9%, 8%, 7%, 6%, 5%, 4%, 3%, 2% or 1%, on an atomic basis. In some embodiments, the aluminum composition of the bulk n-metal layer 44 is in the range of about 2 at. % to about 5 at. %.

The carbon content of the n-metal layer 40 can be affected by, for example, the precursors used to deposit the film and deposition conditions. In some embodiments, the bulk n-metal layer 44 has a carbon content less than or equal to about 20%, 18%, 16%, 14%, 12%, 10%, 9%, 8%, 7%, 6%, 5%, 4%, 3% or 2%, on an atomic basis.

The n-metal layer 40 has a total thickness in the range of about 10 Å to about 30 Å. In some embodiments, the n-metal layer 40 has a total thickness less than or equal to about 20 Å.

The aluminum-rich layer 42 can have a thickness less than or equal to about 10 monolayers. In some embodiments, the aluminum-rich layer 42 is less than about 5 monolayers thick. In some embodiments, the aluminum-rich layer 42 has a thickness less than or equal to about 1 nm. It is believed that the thin Al rich interfacial layer can significantly lower the WF. The film WF can be tuned by adjusting the Al at. %. In some embodiments, the work function is less than or equal to about 4.25 eV, 4.2 eV, 4.15 eV, 4.1 eV, 4.05 eV or 4 eV.

The aluminum-rich layer 42 is located adjacent the high-k capping layer 30 between the high-k capping layer 30 and the bulk n-metal layer 44. In some embodiments, the aluminum-rich layer 42 is located adjacent the high-k capping layer 30 and the high-k dielectric layer 20, as illustrated in FIG. 1B. In some embodiments, the aluminum rich interfacial layer can be at the interface of the $HfO_2$/TiN layers or at the interface of the TiN/TaSi layers. It has been surprisingly found that the bulk tantalum silicide film provides excellent resistivity and has less thickness dependent WF performance with the aluminum rich interfacial layer.

Depending on the high-k capping layer 30 (e.g., TiN) film thickness, the Al can diffuse through the high-k capping layer 30 and reside at the interface of the high-k dielectric layer 20 and the high-k capping layer 30. The Al/TaSi can be integrated with both TiN layers in-situ or by ex-situ deposition. In-situ TiN capping for Al/TaSi may prevent surface oxidation which would artificially increase the film thickness and WF.

The work function of the n-metal layer is typically gets larger as the thickness of the film decreases. For example, the work function of a TiAlC n-metal layer increases by more than 0.06 V as the thickness of the film decreases from 3 nm to 2 nm. It has been surprisingly found that the work function of an Al/TaSi n-metal layer has much lower thickness dependence. In some embodiments, the work function of the n-metal film increases by less than or equal to about 0.05 V as the thickness of the n-metal film decreases from 3 nm to 2 nm. In some embodiments, as the thickness of the n-metal film decreases from 3 nm to 2 nm, the work function increases by less than or equal to about 0.045 V, 0.04 V, 0.035 V, 0.03 V, 0.025 V, 0.02 V, 0.015 V or 0.01 V.

An n-metal capping layer 50 is formed on the n-metal layer 40. The n-metal capping layer 50 can be any suitable material including, but not limited to, titanium nitride. The n-metal capping layer 50 of some embodiments has a thickness in the range of about 10 Å to about 60 Å, or in the range of about 20 Å to about 50 Å.

In some embodiments, a metal layer 60 is formed on the n-metal capping layer 50. The metal layer 60 can be any suitable metal including but not limited to, tungsten, copper and cobalt. In some embodiments, the metal layer 60 comprises tungsten. The metal layer 60 can be formed by any suitable technique including atomic layer deposition, chemical vapor deposition and physical vapor deposition.

"Atomic layer deposition" or "cyclical deposition" as used herein refers to a process comprising the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction, cycloaddition). The substrate, or portion of the substrate, is exposed sequentially to the two or more reactive compounds which are introduced into a reaction zone of a processing chamber.

In a time-domain ALD process, exposure to each reactive compound is separated by a time delay to allow each compound to adhere and/or react on the substrate surface and then be purged from the processing chamber. The reactive gases are prevented from mixing by the purging of the processing chamber between subsequent exposures.

In a spatial ALD process, the reactive gases are flowed into different processing regions within a processing chamber. The different processing regions are separated from adjacent processing regions so that the reactive gases do not mix. The substrate can be moved between the processing regions to separately expose the substrate to the processing gases. During substrate movement, different portions of the substrate surface, or material on the substrate surface, are exposed to the two or more reactive compounds so that any given point on the substrate is substantially not exposed to more than one reactive compound simultaneously. As will be understood by those skilled in the art, there is a possibility that a small portion of the substrate may be exposed to multiple reactive gases simultaneously due to diffusion of the gases within the processing chamber, and that the simultaneous exposure is unintended, unless otherwise specified.

In one aspect of a time-domain ALD process, a first reactive gas (i.e., a first precursor or compound A) is pulsed into the reaction zone followed by a first time delay. A second precursor or compound B is pulsed into the reaction zone followed by a second delay. During each time delay, a purge gas, such as argon, is introduced into the processing chamber to purge the reaction zone or otherwise remove any residual reactive compound or reaction products or by-products from the reaction zone. Alternatively, the purge gas may flow continuously throughout the deposition process so that only the purge gas flows during the time delay between pulses of reactive compounds. The reactive compounds are alternatively pulsed until a predetermined film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In one aspect of a spatial ALD process, a first reactive gas and second reactive gas (e.g., hydrogen radicals) are delivered simultaneously to the reaction zone but are separated by an inert gas curtain and/or a vacuum curtain. The gas curtain can be combination of inert gas flows into the processing chamber and vacuum stream flows out of the processing chamber. The substrate is moved relative to the gas delivery apparatus so that any given point on the substrate is exposed to the first reactive gas and the second reactive gas.

A "pulse" or "dose" as used herein refers to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

Some embodiments of the disclosure provide methods of forming conformal films on a substrate. A conformal film can be deposited on some or all of the surfaces of the substrate. For example, a conformal film may be deposited on a substrate that has at least one surface feature (e.g., a trench or via). A conformal film has the same thickness at the top of the feature as the bottom of the feature. In some embodiments, the conformality of the film is measured as the thickness at the top of the feature relative to the thickness at the bottom of the feature and is greater than or equal to about 90%, 91%, 92%, 93%, 94%, 95%, 96%, 97%, 98%, 99% or about 100%.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A film stack comprising:
   a high-k dielectric layer on a substrate;
   a high-k capping layer on the high-k dielectric layer;
   an n-metal layer on the high-k capping layer, the n-metal layer having an aluminum rich interface adjacent the high-k capping layer between the high-k capping layer and the high-k dielectric layer, the n-metal layer comprises tantalum, silicon and aluminum; and
   an n-metal capping layer on the n-metal layer,
   wherein the aluminum migrates from the n-metal layer through the high-k capping layer.

2. The film stack of claim 1, wherein the high-k dielectric layer comprises $HfO_2$.

3. The film stack of claim 2, wherein the high-k dielectric layer has a thickness in the range of about 10 Å to about 20 Å.

4. The film stack of claim 1, wherein the high-k capping layer comprises titanium nitride.

5. The film stack of claim 4, wherein the high-k capping layer has a thickness in the range of about 5 Å to about 20 Å.

6. The film stack of claim 1, wherein the n-metal layer has a thickness in the range of about 10 Å to about 30 Å.

7. The film stack of claim 1, wherein the n-metal capping layer comprises TiN.

8. The film stack of claim 7, wherein the n-metal capping layer has a thickness in the range of about 10 Å to 60 Å.

9. The film stack of claim 1, further comprising a silicon oxide layer below the high-k dielectric layer.

10. The film stack of claim 9, wherein the silicon oxide layer has a thickness in the range of about 5 Å to about 10 Å.

11. The film stack of claim 1, further comprising a metal layer comprising tungsten above the n-metal capping layer.

12. A method of forming a film stack, the method comprising:
    forming a high-k dielectric layer on a substrate;
    forming a high-k capping layer on the high-k dielectric layer;
    forming an n-metal layer on the high-k capping layer, the n-metal layer having an aluminum rich interface adjacent the high-k capping layer between the high-k capping layer and the high-k dielectric layer, the n-metal layer comprising tantalum, silicon and aluminum; and
    forming an n-metal capping layer on the n-metal layer,
    wherein the aluminum migrates from the n-metal layer through the high-k capping layer.

13. The method of claim 12, wherein the high-k dielectric layer comprises $HfO_2$ with a thickness in the range of about 10 Å to about 20 Å.

14. The method of claim 12, wherein the high-k capping layer comprises titanium nitride with a thickness in the range of about 5 Å to about 20 Å.

15. The method of claim 12, wherein the n-metal layer comprises tantalum, silicon and aluminum and has a thickness in the range of about 10 Å to about 30 Å.

16. The method of claim 12, wherein the n-metal capping layer comprises TiN with a thickness in the range of about 10 Å to 60 Å.

17. The method of claim 12, wherein the substrate comprises a silicon oxide with a thickness in the range of about 5 Å to about 10 Å before formation of the high-k dielectric layer and the method further comprises forming a metal layer comprising tungsten above the n-metal capping layer.

* * * * *